(12) United States Patent
Notte, IV et al.

(10) Patent No.: US 8,124,941 B2
(45) Date of Patent: Feb. 28, 2012

(54) INCREASING CURRENT IN CHARGED PARTICLE SOURCES AND SYSTEMS

(75) Inventors: John A. Notte, IV, Gloucester, MA (US); Randall Percival, Raymond, NH (US); Colin A. Sanford, Atkinson, NH (US); Alexander Grohloski, Salem, MA (US)

(73) Assignee: Carl Zeiss NTS, LLC, Peabody, MA (US)

( * ) Notice: Subject to any disclaimer, the term of this patent is extended or adjusted under 35 U.S.C. 154(b) by 319 days.

(21) Appl. No.: 12/493,566

(22) Filed: Jun. 29, 2009

(65) Prior Publication Data

US 2010/0012839 A1    Jan. 21, 2010

Related U.S. Application Data

(60) Provisional application No. 61/081,246, filed on Jul. 16, 2008.

(51) Int. Cl.
*H01J 37/08* (2006.01)
*H01J 27/26* (2006.01)

(52) U.S. Cl. ............... 250/423 F; 250/309; 250/423 R; 250/424

(58) Field of Classification Search ............. 250/423 F, 250/309, 423 R, 424
See application file for complete search history.

(56) References Cited

U.S. PATENT DOCUMENTS

| 6,337,540 | B1 | 1/2002 | Corbin et al. |
| 7,692,165 | B2 * | 4/2010 | Winkler ............ 250/492.21 |
| 2003/0146707 | A1 | 8/2003 | Goldberg et al. |
| 2007/0138388 | A1 | 6/2007 | Ward et al. |
| 2007/0158558 | A1 | 7/2007 | Ward et al. |
| 2007/0228287 | A1 | 10/2007 | Ward et al. |

FOREIGN PATENT DOCUMENTS

| EP | 1 860 679 | 11/2007 |
| JP | 63 216247 | 9/1988 |
| JP | 01 014848 | 1/1989 |
| JP | 08 083586 | 3/1996 |
| WO | WO 2007/080594 | 7/2007 |

OTHER PUBLICATIONS

Livengood et al., "Helium ion microscope invasiveness and imaging study for semiconductor applications," J. Vac. Sci. Technolog., 25(6):2547-2552, (2007).

* cited by examiner

*Primary Examiner* — Jack Berman
(74) *Attorney, Agent, or Firm* — Fish & Richardson P.C.

(57) ABSTRACT

Disclosed are charged particle systems that include a tip, at least one gas inlet configured to supply gas particles to the tip, and a element having a curved surface positioned to adsorb un-ionized gas particles, and to direct desorbing gas particles to propagate toward the tip. The charged particle systems can include a field shunt connected to the tip, and configured to adjust an electric field at an apex of the tip.

27 Claims, 4 Drawing Sheets

INCREASING CURRENT IN CHARGED PARTICLE SOURCES AND SYSTEMS

CROSS-REFERENCE TO RELATED APPLICATIONS

This application claims priority under 35 U.S.C. §119(e)(1) to U.S. Provisional Application No. 61/081,246 filed Jul. 16, 2008. The contents of this application is hereby incorporated by reference in its entirety.

TECHNICAL FIELD

This disclosure relates to producing charged particles, and in particular, to producing charged particle beams in microscope systems.

BACKGROUND

Samples can be exposed to charged particles for a variety of applications, including sample imaging. Charged particle beams can be formed by ionizing gas particles in a chamber. A relatively small fraction of the gas particles that are introduced into the chamber may be ionized to form the charged particles.

SUMMARY

This disclosure generally relates to charged particle systems that produce ion beams which are used for measurement of sample properties, including imaging of samples. The charged particle systems can include a gas particle concentrator that increases an ionization efficiency of gas particles that are introduced into the systems. Alternatively, or in addition, the charged particle systems can include a field shunt that can be used to control an electric field amplitude at an apex of a tip in the systems. By controlling the electric field amplitude at the tip, the average ion energy in the ion beam can be adjusted to a desired value.

In general, in a first aspect, the disclosure features a charged particle source that includes a tip, at least one gas inlet configured to supply gas particles to the tip, and an element having a curved surface positioned to adsorb un-ionized gas particles, and to direct desorbing gas particles to propagate toward the tip.

In another aspect, the disclosure features a charged particle source that includes a tip, at least one gas inlet configured to supply gas particles to the tip, and means for adsorbing un-ionized gas particles, and directing desorbing gas particles to propagate toward the tip.

In a further aspect, the disclosure features a charged particle source that includes a tip and at least one gas inlet configured to supply gas particles to the tip, and a field shunt configured to modulate an electric field at an apex of the tip, where in a fully retracted position of the field shunt, the electric field has a first amplitude, and in a fully extended position of the field shunt, the electric field has a second amplitude larger than the first amplitude.

In another aspect, the disclosure features a charged particle source that includes: (a) a tip, a housing that encloses the tip, and at least one gas inlet in fluid communication with an interior of the housing and configured to supply gas particles to the tip; and (b) an element positioned within the housing and configured to modulate an electric field amplitude at an apex of the tip. The element can have a cylindrical portion and a conical portion attached to the cylindrical portion. A maximum internal diameter of the conical portion can correspond to an internal diameter of the cylindrical portion, and a minimum internal diameter of the conical portion can be less than the maximum internal diameter. An end of the element corresponding to the minimum internal diameter can be positioned adjacent to the tip.

In a further aspect, the disclosure features a charged particle source that includes: (a) a tip; (b) at least one gas inlet configured to supply gas particles to the tip; and (c) an element having a surface shaped to adsorb un-ionized gas particles, and to direct desorbing gas particles to propagate toward the tip.

In another aspect, the disclosure features a charged particle source that includes: (a) a tip and at least one gas inlet configured to supply gas particles to the tip; (b) a field shunt configured to modulate an electric field at an apex of the tip; and (c) an electronic controller coupled to the field shunt. During operation, the electronic controller can be configured to apply an electrical potential to the field shut to modulate the electric field at the apex of the tip.

Embodiments of the charged particle source can include one or more of the following features.

The element can be an extractor. The curved surface can be a surface of the extractor that faces the tip. Alternatively, or in addition, the charged particle source can include an extractor, and the element can be positioned between the tip and the extractor.

The at least one gas inlet can include 2 or more gas inlets (e.g., 60 or more gas inlets).

The element can include a plurality of apertures positioned to permit removal of gas particles from the charged particle source.

The curved surface can be spherical. Alternatively, or in addition, the curved surface can be parabolic. The curved surface can be an arc-shaped surface that corresponds to an angular arc of more than 180 degrees.

The curved surface can be shaped so that surface normals to at least 50% or more (e.g., at least 90% or more) of the curved surface intersect at the position of the tip.

During operation, a concentration of gas particles at the position of the tip can be larger by 5% or more (e.g., 15% or more) than a concentration of gas particles at the position of the tip in the absence of the curved surface.

During operation, an average ionization efficiency of the gas particles is 3 parts in $10^{10}$ or more (e.g., 1 part in $10^9$ or more).

During operation, a beam current of the charged particle source can be 100 pA or more, and a pressure of gas particles in the charged particle source can be $1 \times 10^{-3}$ Torr or less (e.g., a beam current of the charged particle source can be 1 nA or more, and a pressure of gas particles in the charged particle source can be $5 \times 10^{-5}$ Torr or less).

The charged particle source can include a field shunt connected to the tip, and configured to adjust an electric field at an apex of the tip. The field shunt can be extendible along a direction parallel to an axis of the charged particle source. The tip can be at a first electrical potential, and the field shunt can be at a second electrical potential different from the first electrical potential. A difference between the first and second electrical potentials can be zero or more (e.g., 2 kV or more, 5 kV or more, 10 kV or more, 20 kV or more). Alternatively, or in addition, a difference between the first and second electrical potentials can be equal to or greater than 0.25 times a voltage of the ions (e.g., equal to or greater than 0.5 times the voltage of the ions, equal to or greater than 0.75 times the voltage of the ions, equal to or greater than the voltage of the ions, equal to or greater than 1.25 times the voltage of the ions, equal to or greater than 1.5 times the voltage of the ions, equal to or greater than 2 times the voltage of the ions, equal to or greater than 2.5 times the voltage of the ions).

The gas particles can include noble gas atoms. The noble gas atoms can include helium.

The charged particle source can be a gas field ion source.

The charged particle source can include a housing that encloses the tip and the element.

The field shunt can be a mechanically extendible field shunt configured to move between the fully retracted position and the fully extended position. The field shunt can be extendible to a plurality of different lengths relative to the fully retracted position.

A difference between the first and second amplitudes can be 0 V/Å or more (e.g., 1 V/Å or more, 2 V/Å or more, 3 V/Å or more, 5 V/Å or more, 7 V/Å or more, 10 V/Å or more).

A difference between a first average ion energy when the field shunt is in the fully retracted position and a second average ion energy when the field shunt is in the fully extended position can be 2 keV or more (e.g., 10 keV or more).

The field shunt can include a plurality of interchangeable field shunts of different lengths, each of which is configured to connect to a base of the tip.

The charged particle source can include an element having a curved surface positioned to adsorb un-ionized gas particles, and to direct desorbing gas particles to propagate toward the tip.

The field shunt can have a cylindrical shape. The charged particle source can include a base to which the tip is attached, where a maximum diameter of an opening in a first end of the field shunt attached to the base is larger than a maximum diameter of an opening in a second end of the field shunt adjacent to an apex of the tip.

The field shunt can include a cylindrical portion of constant internal diameter, and a conical portion of varying internal diameter. The conical portion can include a first end and a second end, an outside diameter of the first end being larger than an outside diameter of the second end, where the second end forms an end of the field shunt that is positioned adjacent to an apex of the tip.

The at least one gas inlet can include one or more channels (e.g., two or more, three or more, four or more, five or more, six or more, eight or more, ten or more, or even more) formed in the element.

Embodiments of the charged particle source can include one or more of the following advantages.

In some embodiments, a particle concentrator can be used to improve the efficiency of feed gas ionization in a charged particle source. For example, use of the particle concentrator can lead to a higher fraction of feed gas particles being ionized in the charged particle source. As a result, the brightness of the charged particle source can be increased without increasing the average pressure of the feed gas in the region surrounding a tip in the charged particle source. Further, using the particle concentrator, as a result, the feed gas can be directed to propagate toward the tip, which can help to reduce the presence of neutral gas particles in the ion beam path.

In certain embodiments, a shape and orientation of the feed gas inlets can be selected to provide a collimated gas stream directed toward the tip. Divergence of the feed gas particles can be controlled (e.g., by providing feed gas inlets with a length-to-diameter ratio of about 5:1 or more), which can help to ensure that a flux of feed gas particles reaching the tip is relatively high, while maintaining a relatively low background pressure in the chamber. Feed gas particles that are not ionized in the vicinity of the tip can be removed from the region of the tip via pumping, so that these neutral particles do not enter the ion beam path.

In certain embodiments, the particle concentrator and multiple feed gas inlets can be used to ensure that a spatial distribution of feed gas particles in the vicinity of a tip is more homogeneous than a spatial distribution of feed gas particles that results from a single gas inlet with no particle concentrator. By producing a relatively homogeneous spatial distribution of feed gas particles in the vicinity of the tip, for example, charged particle beams derived from emission from only one of the tip apex atoms can have similar brightness.

In some embodiments, an adjustable field shunt can be used to maintain a particular electric field amplitude at the tip while adjusting an electrical potential applied to the tip. Generally, during operation of the ion source, the electric field at the tip is maintained within a relatively narrow range, corresponding to a range of electric field amplitudes in which particles of the feed gas undergo ionization (e.g., a range of 3.5 V/Å to 4.5 V/Å). The electric field amplitude at the tip can be maintained within this range (or, generally, at any desired value) while the electrical potential applied to the tip changes if an electrical potential applied to the shunt also changes, and/or if the position of the adjustable shunt changes (e.g., the shunt is extended or retracted with respect to the tip). By changing either or both of the position of the shunt and the electrical potential applied to the shunt, changes in the potential applied to the tip can be compensated by the shunt adjustments, leaving the electric field amplitude at the tip unchanged. In this way, the energy of the ionized gas particles can be adjusted without adjusting the field amplitude at the tip, and without including additional accelerating elements in the charged particle column. Typically, accelerating elements include large, expensive insulators. By adjusting the field shunt in this manner, accelerating elements may not be needed.

In certain embodiments, the adjustable field shunt can be at an electrical potential that is different from an electrical potential of the tip. By adjusting the electrical potential applied to the field shunt, the electric field at the tip can be kept substantially constant while the accelerating voltage applied by the tip can be adjusted without mechanically moving any elements of the charged particle column. An electrically adjustable field shunt is typically simpler and easier to operate than a mechanically adjustable field shunt.

The details of one or more embodiments are set forth in the accompanying drawings and the description below. Other features and advantages will be apparent from the description, drawings, and claims.

DESCRIPTION OF DRAWINGS

Like reference symbols in the various drawings indicate like elements.

DETAILED DESCRIPTION

Typically, charged particle beams such as gas ion beams that are used to interrogate samples are produced in multipurpose microscope systems. Microscope systems that use a gas field ion source to generate ions that can be used in sample analysis (e.g., imaging) are referred to as gas field ion microscopes. A gas field ion source is a device that includes a tip (typically having an apex with 10 or fewer atoms) that can be used to ionize neutral gas species to generate ions (e.g., in the form of an ion beam) by bringing the neutral gas species into the vicinity of the tip (e.g., within a distance of about four to five angstroms) while applying a high positive potential (e.g., one kV or more relative to the extractor (see discussion below)) to the apex of the tip. In some embodiments, the tip can be electrically conductive.

Figure 1:
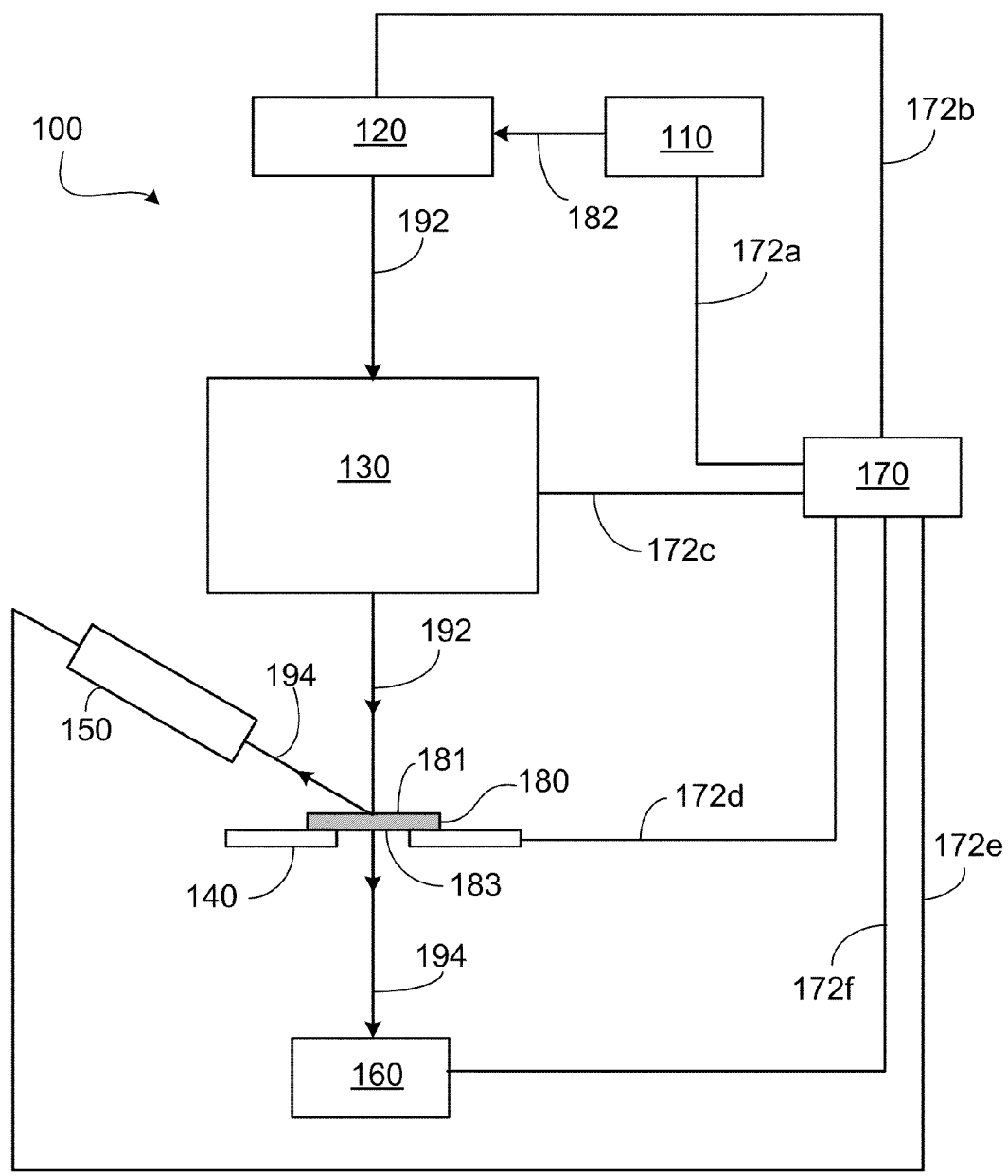
FIG. 1 is a schematic diagram of an ion microscope system.

FIG. 1 shows a schematic diagram of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172a-172f. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160.

Figure 2:
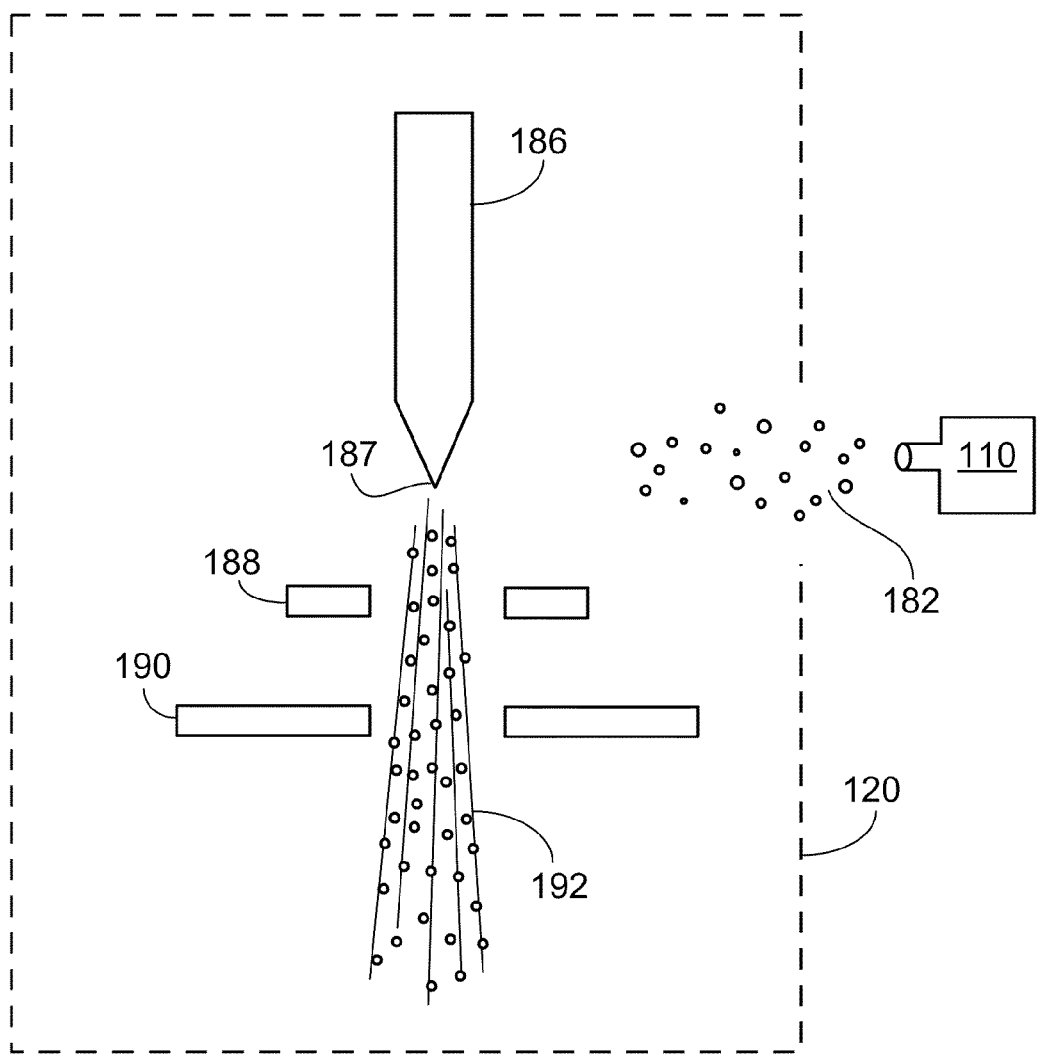
FIG. 2 is a schematic diagram of a gas field ion source.

As shown in FIG. 2, gas source 110 is configured to supply one or more gases 182 to gas field ion source 120. Gas source 110 can be configured to supply the gas(es) at a variety of purities, flow rates, pressures, and temperatures. In general, at least one of the gases supplied by gas source 110 is a noble gas (helium (He), neon (Ne), argon (Ar), krypton (Kr), xenon (Xe)), and ions of the noble gas are desirably the primary constituent in ion beam 192.

Optionally, gas source 110 can supply one or more gases in addition to the noble gas(es); an example of such a gas is nitrogen. Typically, while the additional gas(es) can be present at levels above the level of impurities in the noble gas(es), the additional gas(es) still constitute minority components of the overall gas mixture introduced by gas source 110.

Gas field ion source 120 is configured to receive the one or more gases 182 from gas source 110 and to produce gas ions from gas(es) 182. Gas field ion source 120 includes a tip 186 with a tip apex 187, an extractor 190 and optionally a suppressor 188.

Tip 186, which can be electrically conductive, can be formed of various materials. In some embodiments, tip 186 is formed of a metal (e.g., tungsten (W), tantalum (Ta), iridium (Ir), rhenium (Rh), niobium (Nb), platinum (Pt), molybdenum (Mo)). In certain embodiments, an electrically conductive tip 186 can be formed of an alloy. In some embodiments, an electrically conductive tip 186 can be formed of a different material (e.g., carbon (C)).

During use, tip 186 is biased positively (e.g., approximately 20 kV) with respect to extractor 190, extractor 190 is negatively or positively biased (e.g., from −20 kV to +50 kV) with respect to an external ground, and optional suppressor 188 is biased positively or negatively (e.g., from −5 kV to +5 kV) with respect to tip 186. When tip 186 is formed of an electrically conductive material, the electric field of tip 186 at tip apex 187 points outward from the surface of tip apex 187. Due to the shape of tip 186, the electric field is strongest in the vicinity of tip apex 187. The strength of the electric field of tip 186 can be adjusted, for example, by changing the positive voltage applied to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130.

In general, ion optics 130 are configured to direct ion beam 192 onto surface 181 of sample 180. Ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic and other ion optical elements that are configured as desired. By manipulating the electric field strengths of one or more components (e.g., electrostatic deflectors) in ion optics 130, ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181.

When ion beam 192 impinges on sample 180, a variety of different types of particles 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of particles resulting from the interaction between ion beam 192 and sample 180. As shown in FIG. 1, detector 150 is positioned to detect particles 194 that originate primarily from surface 181 of sample 180, and detector 160 is positioned to detect particles 194 that emerge primarily from surface 183 of sample 180 (e.g., transmitted particles). In general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 180. Typically, this information is determined by obtaining one or more images of sample 180. By rastering ion beam 192 across surface 181, pixel-by-pixel information about sample 180 can be obtained in discrete steps. Detectors 150 and/or 160 can be configured to detect one or more different types of particles 194 at each pixel.

The operation of microscope system 100 is typically controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180 (e.g., topography information, material constituent information, crystalline information, voltage contrast information, optical property information, magnetic information ), which can optionally be in the form of an image, a graph, a table, a spreadsheet, or the like. Typically, electronic control system 170 includes a user interface that features a display or other kind of output device, an input device, and a storage medium.

In certain embodiments, electronic control system 170 can be configured to control various properties of ion beam 192. For example, control system 170 can control a composition of ion beam 192 by regulating the flow of gases into gas field ion source 120. By adjusting various potentials in ion source 120 and ion optics 130, control system 170 can control other properties of ion beam 192 such as the position of the ion beam on sample 180, and the average energy of the incident ions.

Detectors 150 and 160 are depicted schematically in FIG. 1, with detector 150 positioned to detect particles from surface 181 of sample 180 (the surface on which the ion beam impinges), and detector 160 positioned to detect particles from surface 183 of sample 180. In general, a wide variety of different detectors can be employed in microscope system 200 to detect different particles, and microscope system 200 can typically include any desired number of detectors. The configuration of the various detector(s) can be selected in accordance with particles to be measured and the measurement conditions. In some embodiments, a spectrally resolved detector can be used. Such detectors are capable of detecting particles of different energy and/or wavelength, and resolving the particles based on the energy and/or wavelength of each detected particle.

Ion beam systems and methods are generally disclosed, for example, in U.S. Patent Application Publication No. US 2007/0158558, the entire contents of which are incorporated herein by reference.

In certain charged particle systems, the efficiency of feed gas 182 ionization can be relatively low. For example, in some embodiments, approximately 1 gas particle in $10^{10}$ is ionized to form ion beam 192. This ionization efficiency can limit the available ion beam current and brightness in the charged particle system.

When a sample is exposed to an ion beam generated by the charged particle system to measure one or more properties of the sample, the measurement time depends, in part, on the available ion beam current. Larger ion beam currents generally yield a brighter charged particle source, which reduces measurement times (e.g., image acquisition times) and enables use of the ion beam in a broader range of applications. Brighter charged particle sources typically can be used to acquire higher resolution images.

To increase the ion beam current (and the brightness of the charged particle source), the pressure of feed gas 182 in the charged particle system can be increased (e.g., by feeding in additional gas particles). However, increasing the gas pressure in the charged particle source can have undesirable consequences, including increased scattering of the ion beam from un-ionized gas particles, adsorption of un-ionized gas particles on sample surfaces, and more generally, the introduction of larger numbers of gaseous impurities relative to the desired feed gas.

Figure 3:
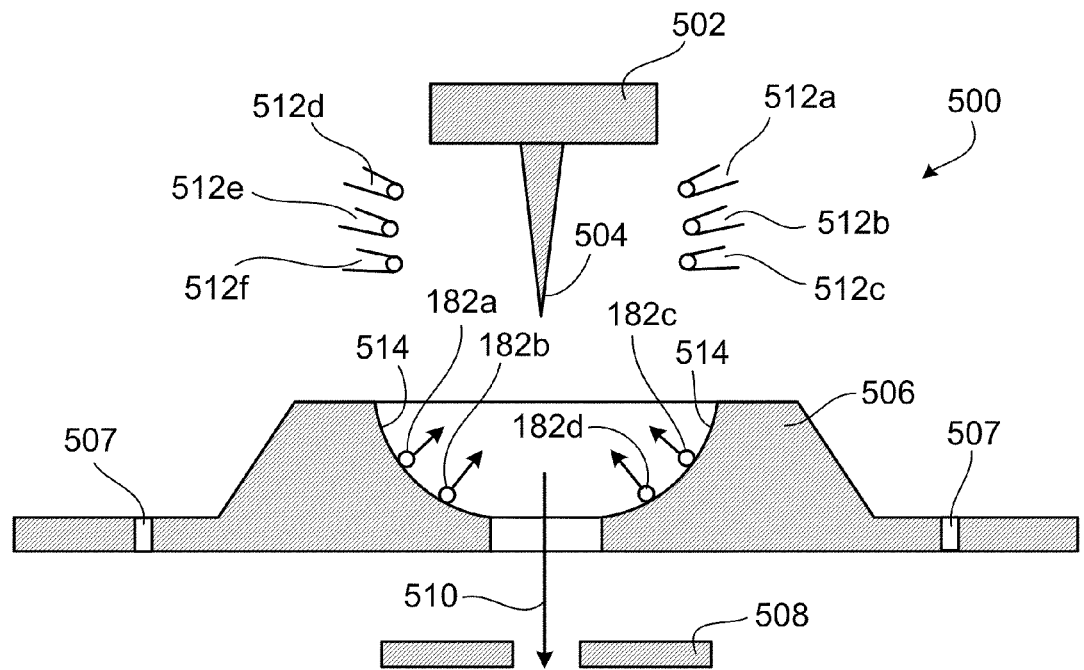
FIG. 3 is a schematic cross-sectional diagram of a charged particle source that includes a particle concentrator.

Another approach to increasing the ion beam current and source brightness is to improve the efficiency of feed gas 182 ionization via a particle concentrator. FIG. 3 shows a schematic cross-sectional diagram of a charged particle source 500 that includes a particle concentrator. Source 500 includes a base 502 that supports a tip 504 that includes an apex. An extractor 506 is positioned adjacent to tip 504, which generates an ion beam that propagates along the direction shown by arrow 510. A lens 508 is positioned after extractor 506 along the direction of propagation.

Source 500 includes a plurality of gas inlets 512a-f that introduce feed gas 182 in the vicinity of tip 504. When a feed gas particle enters an ionization region surrounding the apex of tip 504, the gas particle is ionized and is accelerated away from tip 504 by a large positive potential that is applied to tip 504; the accelerated ion forms a portion of ion beam 192. Source 500 also includes gas outlets 507 (implemented in FIG. 3 as apertures formed in extractor 506) that are used to remove un-ionized gas particles from source 500.

By using a plurality of gas inlets 512a-f, a relatively homogeneous distribution of feed gas 182 can be formed about the apex of tip 504. Typically, the apex of tip 504 includes from 1-20 atoms, and ions generated in the vicinity of only one of the tip atoms can be allowed to form ion beam 192. Ions generated from the other tip atoms can be blocked using filtering elements in source 500 (not shown in FIG. 3) and/or by one or more elements of ion optics 130. By forming a relatively homogeneous distribution of feed gas 182 about the apex of tip 504, ion beams generated from each of the tip atoms can have ion beam currents (and/or brightnesses) that are similar.

FIG. 3 shows six gas inlets 512a-f that introduce feed gas 182 in the vicinity of tip 504. In general, however, any number of gas inlets can be used to supply feed gas 182. In some embodiments, the number of gas inlets can be one or more (e.g., two or more, four or more, six or more, eight or more, ten or more, 15 or more, 20 or more, 30 or more, 40 or more, 50 or more, 60 or more, 70 or more, 80 or more, 90 or more). As discussed above, by using multiple gas inlets, a relatively homogeneous distribution of gas particles can be formed about the apex of tip 504.

In certain embodiments, a difference between a maximum current generated from one of the tip apex atoms and a minimum current generated from any of the other tip apex atoms is 10 nA or less (e.g., 1 nA or less, 100 pA or less, 1 pA or less, 1 fA or less).

In some embodiments, a difference between a maximum brightness of an ion beam generated via ionization of gas particles at one of the tip apex atoms and a minimum brightness of an ion beam generated via ionization of gas particles at any of the other tip apex atoms is $10^{11}$ A/cm$^2$-sr or less (e.g., $10^{10}$ A/cm$^2$-sr or less, $10^9$ A/cm$^2$-sr or less, $10^8$ A/cm$^2$-sr or less, $10^7$ A/cm$^2$-sr or less, $10^6$ A/cm$^2$-sr or less).

As discussed above, during operation of charged particle source 500, a large fraction of feed gas 182 particles do not pass close enough to tip 504 to undergo ionization, and are therefore wasted. To improve the efficiency of feed gas 182 ionization, source 500 includes a particle concentrator. In FIG. 3, the particle concentrator is implemented as a curved surface 514 of extractor 506 that faces tip 504.

Curved surface 514 is shaped to improve feed gas 182 ionization in charged particle source 500. When feed gas 182 is introduced into source 500 without a particle concentrator, gas particles that do not pass through the ionization zone surrounding the apex of tip 504 propagate away from tip 504, and are eventually removed from the source 500 via pumping.

However, when the particle concentrator is present, some of the gas particles that do not pass through the ionization zone of tip 504 on a first pass through source 500 adsorb onto curved surface 514. FIG. 3 shows gas particles 182a-d adsorbed onto surface 514. Each of the adsorbed particles 182a-d can then desorb from surface 514, and can propagate in the direction of tip 504, making another pass through source 500. On the second pass through source 500, a fraction of the desorbed gas particles pass through the ionization zone of tip 504, and are ionized, forming a portion of ion beam 192.

Repeated adsorption and desorption of un-ionized gas particles can occur from surface 514. As a result of these processes, the efficiency with which feed gas 182 is ionized is improved, and an overall beam current of ion beam 192 (and/or brightness of ion beam 192) is increased relative to a similar system in which no particle concentrator is present.

Figure 4:
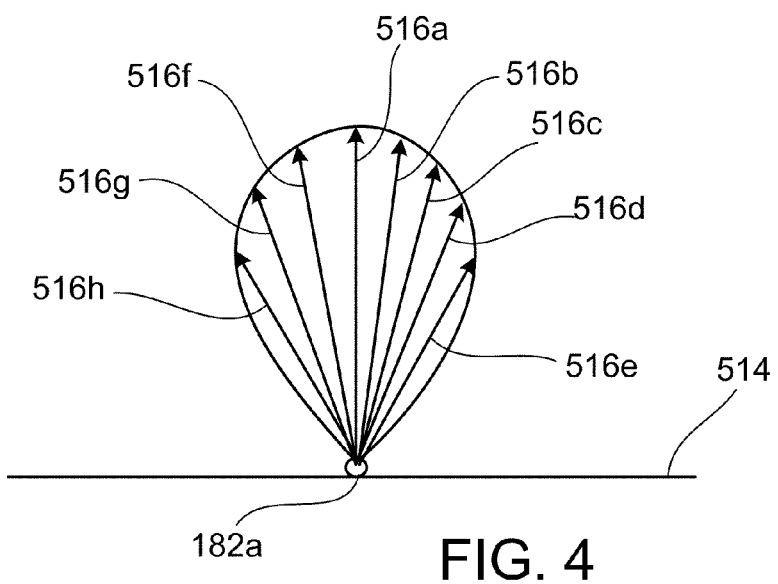
FIG. 4 is a schematic diagram showing desorption probabilities for a gas particle adsorbed to a surface.

Surface 514 is typically shaped to promote gas particle desorption in the direction of the apex of tip 504. FIG. 4 shows exemplary desorption probabilities 516a-h for a gas particle 182a adsorbed onto surface 514, where the length of each arrow corresponds to the probability of desorption of particle 182a in the direction indicated by the arrow. As shown in FIG. 4, desorption can occur with highest probability in the forward direction (e.g., in a normal direction to surface 514) in certain embodiments.

In some embodiments, surface 514 is shaped so that surface normals at every point of surface 514 intersect approximately at the position of the apex of tip 504. More generally, surface 514 can be shaped so that surface normals to at least 20% or more (e.g., 30% or more, 40% or more, 50% or more, 60% or more, 70% or more, 80% or more, 90% or more) of surface 514 intersect approximately at the position of the apex of tip 504.

In certain embodiments, surface 514 has a spherical shape. In some embodiments, surface 514 has a parabolic shape. More generally, surface 514 can have a variety of different shapes, including both regular shapes and irregular shapes, to increase the concentration of gas particles 182 in the vicinity of the apex of tip 504. Moreover, surface 514 can be shaped to adsorb feed gas 182 particles that make more than one (e.g., two or more, three or more, four or more, five or more) pass(es) through source 500, any of which can result in adsorption of the particles to surface 514 and subsequent desorption and propagation in the direction of the tip 504.

In some embodiments, surface 514 can be arc-shaped, and can correspond to an angular arc of 30 degrees or more (e.g., 60 degrees or more, 90 degrees or more, 120 degrees or more, 150 degrees or more, 180 degrees or more, 210 degrees or more, 240 degrees or more, 270 degrees or more).

In certain embodiments, surface 514 can be formed of a plurality of planar surface segments. For example, surface 514 can include a plurality of surface segments that are joined to form a stepped surface. Adjacent surface segments can be orthogonal to one another, forming a stepped surface 514. Alternatively, or in addition, some or all of the steps on surface 514 can be formed by adjacent surface segments that are not orthogonal to one another. For example, surface 514 can be formed by a plurality of angled surface segments, each of which is planar; no adjacent surface segments among the plurality of segments may be orthogonal, and the plurality of angled surface segments can combine to form surface 514 having a series of planar, progressively tilting segments that approximate the curvature of a curved surface (e.g., a spherical and/or parabolic surface). Surface 514 can generally include any number of surface segments (e.g., two surface segments, three surface segments, five surface segments, eight surface segments, 12 surface segments, 16 surface segments, 20 surface segments, or even more than 20 surface segments). The surface segments can be oriented, in general, to approximate a curved surface having any desired regular or irregular shape and/or curvature.

In some embodiments, surface 514 can be a single planar surface, oriented to promote gas particle desorption in the direction of the apex of tip 504. Further, in general, surface 514 can include both non-planar portions and planar portions, typically positioned in any arrangement that leads to promotion of gas particle desorption in the direction of the apex of tip 504.

Figure 5:
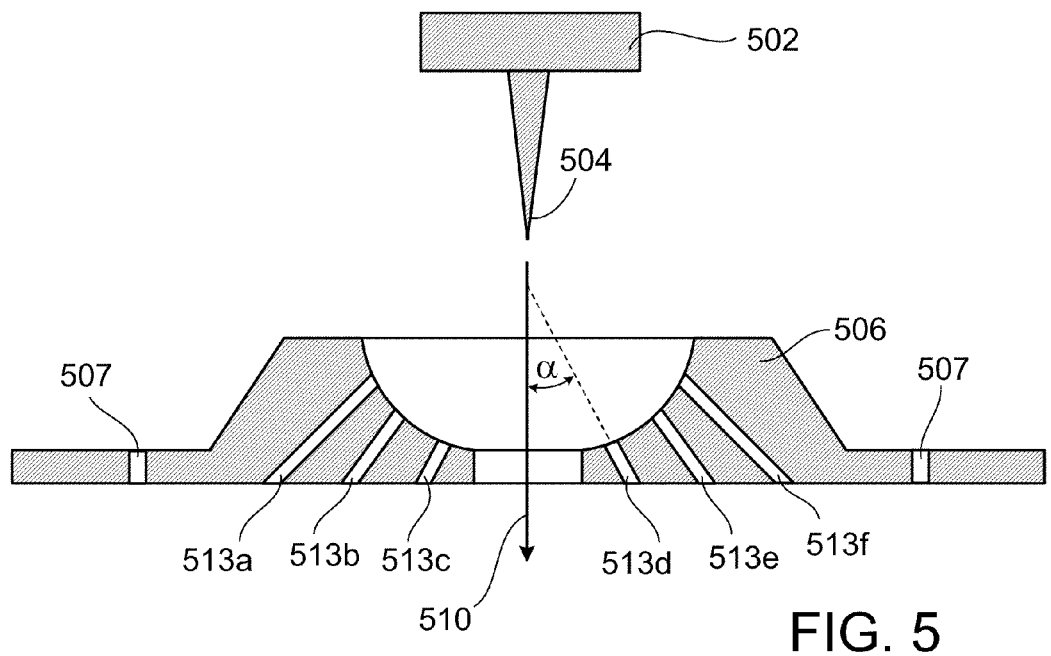
FIG. 5 is a schematic cross-sectional diagram showing an embodiment of a particle concentrator.

Gas inlets 512a-f are positioned above extractor 506 in FIG. 3. In some embodiments, gas inlets can be formed as channels within extractor 506 to supply feed gas 182 to tip 504. FIG. 5 shows an embodiment of an extractor 506 that includes a plurality of channels 513a-f formed in the extractor, and oriented to direct feed gas 182 toward tip 504. Six channels are shown in FIG. 5. In general, however, extractor 506 can include any desired number of channels for introducing feed gas. By positioning channels 513a-f within extractor 506, the feed gas may be directed more efficiently to tip 504 than for other arrangements of gas inlets. In particular, shadowing effects—which can arise when feed gas 182 is introduced along trajectories that are nearly tangent to the surface of tip 504, and which can reduce the efficiency of feed gas ionization—can be reduced and/or eliminated.

In some embodiments, to avoid shadowing effects and to promote efficient feed gas ionization, an angle $\alpha$ between an axis of a gas channel (e.g., any of channels 513a-f) and the ion beam propagation direction (e.g., shown by arrow 510) is 60 degrees or less (e.g., 50 degrees or less, 40 degrees or less, 30 degrees or less, 20 degress or less, 10 degrees or less).

By increasing the concentration of gas particles 182 in the vicinity of the apex of tip 504, the particle concentrator (e.g., curved surface 514) improves the efficiency of feed gas 182 ionization in source 500. In some embodiments, the concentration of feed gas 182 in the vicinity of the apex of tip 504 is increased by a factor of 1% or more (e.g., 2% or more, 3% or more, 5% or more, 10% or more, 15% or more, 20% or more, 25% or more, 30% or more, 40% or more, 50% or more, 75% or more, or even more) by the particle concentrator, relative to the concentration of feed gas 182 in the vicinity of the apex of tip 504 that would be produced in the absence of the particle concentrator.

In certain embodiments, by using a particle concentrator, an average ionization efficiency of the feed gas in source 500 is 2 parts in $10^{10}$ or more (e.g., 3 parts in $10^{10}$ or more, 4 parts in $10^{10}$ or more, 5 parts in $10^{10}$ or more, 6 parts in $10^{10}$ or more, 8 parts in $10^{10}$ or more, 1 part in $10^9$ or more, 5 parts in $10^9$ or more, 1 part in $10^8$ or more, or even more). By improving the ionization efficiency of the feed gas, ion beam 192 can have a higher ion current and/or brightness, without increasing the supply of gas particles to source 500.

In some embodiments, an average ion beam current in ion beam 192 is 1 fA or more (e.g., 100 fA or more, 1 pA or more, 100 pA or more, 1 nA or more, 100 nA or more). Higher average ion beam currents typically correspond to brighter ion sources when other ion beam properties (e.g., spot size) remain relatively constant.

In certain embodiments, a pressure of feed gas 182 in source 500 is $1\times10^{-7}$ Torr or more (e.g., $5\times10^{-7}$ Torr or more, $1\times10^{-6}$ Torr or more, $5\times10^{-6}$ Torr or more, $1\times10^{-5}$ Torr or more) and/or $5\times10^{-3}$ Torr or less (e.g., $1\times10^{-3}$ Torr or less, $5\times10^{-4}$ Torr or less, $1\times10^{-4}$ Torr or less, $5\times10^{-5}$ Torr or less).

In some embodiments, the particle concentrator can be implemented in a manner other than as a curved surface of extractor 506. For example, in certain embodiments, the particle concentrator can be implemented as a curved surface of an additional element positioned in source 500 between tip 504 and extractor 506. In some embodiments, an electrical potential is applied to the additional optical element, and the additional optical element functions as a lens, a deflector, or as another type of charged particle optical element.

In certain embodiments, source 500 can include elements for adjusting the electric field generated by tip 504 to accelerate particles 182. By controlling the tip electric field, an average energy of the ions in ion beam 192 can be adjusted.

Figure 6:
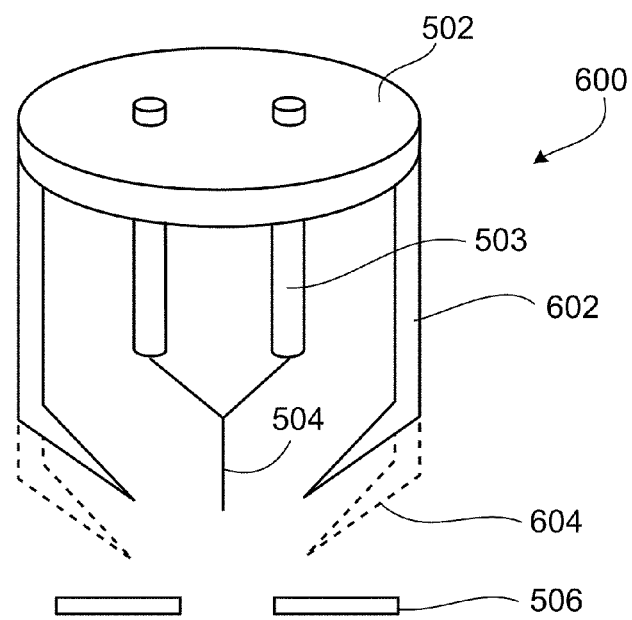
FIG. 6 is a schematic diagram of a charged particle source that includes a field shunt.

FIG. 6 shows a portion of a charged particle source 600 that includes an adjustable field shunt for controlling the electric field amplitude at the source's tip. Source 600 includes a base 502 and a tip 504 mounted to base 502 via high voltage feedthroughs 503. An extractor 506 is positioned adjacent to tip 504. Adjustable field shunt 602 is also positioned on base 502, and is extendible between a retracted position (shown in solid lines in FIG. 6) and an extended position (shown in dotted lines).

As shown in FIG. 6, in some embodiments, field shunt 602 can have a cylindrical shape. The end of field shunt 602 that is attached to base 502 has an opening having a maximum diameter that is larger than a maximum diameter of the opening at the other end of field shunt 602 (e.g., adjacent to the apex of tip 504). Field shunt 602 includes a cylindrical portion having a constant internal diameter and, attached to the cylindrical portion, a conical portion with a varying internal diameter that tapers to form the smaller maximum diameter opening in the end of the field shunt that is adjacent to tip 504. The outside diameter of field shunt 602 at the end closest to tip 504 is smaller than the outside diameter of the cylindrical portion of field shunt 602, as shown in FIG. 6.

In certain embodiments, field shunt 602 can have a shape other than cylindrical. For example, shunt 602 can have a conical shape. In some embodiments, shunt 602 can include a plurality of steps formed in the surface of the shunt. The steps can be formed of adjacent planar surface segments that are oriented either orthogonally or non-orthogonally with respect to one another. The surface segments together can form a shunt surface that approximates the shape of a continuous surface, for example.

In some embodiments, field shunt 602 is not attached to base 502. For example, field shunt 602 can be attached to another surface in the charged particle source. The surface to which the shunt is attached can be an electrically conductive surface or a non-conductive surface. An electrical potential can be applied to shunt 602, either directly or via the surface to which shunt 602 is connected, to adjust the electric field amplitude at tip 504.

During operation, electronic control system 170 applies a relatively large positive potential (e.g., approximately 30 kV) to tip 504. In certain embodiments, field shunt 602 is in electrical communication with tip 504, and is therefore maintained at the same potential as tip 504. To adjust the electric field amplitude at the apex of tip 504, shunt 602 can be mechanically extended or retracted relative to tip 504. For example, to decrease the electric field amplitude, shunt 602 can be retracted so that it is positioned closer to tip 504. Conversely, to increase the electric field amplitude, shunt 602 can be extended so that it is positioned further from tip 504.

In some embodiments, a maximum extension of shunt 602, from a fully retracted position to a fully extended position, measured along an axis of the charged particle source, is 0.5 mm or more (e.g., 1.0 mm or more, 2.0 mm or more, 3.0 mm or more, 5.0 mm or more, 7.0 mm or more, 10 mm or more, 25 mm or more).

Typically, during operation, a particular minimum electric field amplitude is maintained at the apex of tip 504 to cause ionization of gas particles, and field shunt 602 is adjusted (e.g., by electronic control system 170, which can receive instructions from a system operator) to maintain the electric field amplitude at the apex of tip 504. The minimum electric field amplitude can correspond to a critical field amplitude for particle ionization (e.g., about 4.4 V/angstrom), and field shunt 602 can be used to selectively increase or decrease the electric field amplitude in small increments. In general, during operation, ions generated at tip 504 are accelerated by the potential difference between tip 504 and extractor 506. To adjust the energies of the accelerated ions, the potential difference between 504 and extractor 506 can be changed by changing the electrical potential applied to tip 504. However, changing the potential applied to tip 504 also changes the electric field amplitude at the apex of tip 504. To maintain a selected value of the electric field amplitude at the apex of tip 504, field shunt 602 can be adjusted to compensate for the change in field amplitude; by suitably adjusting shunt 602, a selected electric field amplitude at the apex of tip 504 can be maintained, even when the electrical potential applied to tip 504 is changed to control ion energies. In this manner, charged particle energies can be controlled without using one or more accelerating stages in source 600. In particular, use of shunt 602 enables the charged particle source to accelerate ions to higher energies, while maintaining a selected electric field amplitude at the apex of tip 504.

Use of a field shunt can stabilize the electrical sub-system of charged particle source 600. For example, in certain particle sources that do not include a field shunt, both tip 504 and extractor 506 are maintained at large positive electrical potentials by a combination of two high voltage power supplies. To maintain the potential on extractor 506, the two high voltage supplies are connected together. In this arrangement, the overall stability of charged particle source 600 (e.g., variations in the current of ion beam 192) can be significantly affected by even small changes (e.g., ripples) in the voltage supplied by either high voltage supply. In contrast, use of field shunt 602 eliminates the second high voltage supply, reducing variations in the supply voltage and simplifying the construction and operation of source 600.

In some embodiments, field shunt 602 is not mechanically extendible. Instead, charged particle source 600 can include a plurality of field shunts, each having a different length (e.g., corresponding to a different extension of the field shunt with respect to tip 504). To select the electric field amplitude in the vicinity of the apex of tip 504, a field shunt of a suitable length is selected for use, and clamped to a support (e.g., base 502, or another support in the charged particle source) such that it is in electrical communication with tip 504. Adjustment of the electric field amplitude at tip 504 is achieved by selecting field shunts of different lengths.

In certain embodiments, the field shunt (e.g., either extendible field shunt 602 or a fixed-length field shunt) can be at an electrical potential that is different from the electrical potential of tip 504. The potential applied to the field shunt can be varied by electronic control system 170 to further control and/or maintain the electric field amplitude in the vicinity of the apex of tip 504, particularly when the potential difference between tip 504 and extractor 506 is changed. In some embodiments, by varying the shunt potential, the electric field amplitude at the apex of tip 504 can be adjusted or maintained without mechanically adjusting the shunt (e.g., extending or retracting shunt 602, or selecting a shunt of a different length).

In some embodiments, a difference between an electrical potential applied to tip 504 and an electrical potential applied to the field shunt is 0 V or more (e.g., 100 V or more, 500 V or more, 1 kV or more, 2 kV or more) and/or 7 kV or less (e.g., 6 kV or less, 5 kV or less, 4 kV or less, 3 kV or less).

In certain embodiments, a differenece between an electrical potential applied to tip 504 and an electrical potential applied to the field shunt can be equal to or greater than 0.25 times a voltage of the ions (e.g., equal to or greater than 0.5 times the voltage of the ions, equal to or greater than 0.75 times the voltage of the ions, equal to or greater than the voltage of the ions, equal to or greater than 1.25 times the voltage of the ions, equal to or greater than 1.5 times the voltage of the ions, equal to or greater than 2 times the voltage of the ions, equal to or greater than 2.5 times the voltage of the ions).

In some embodiments, a difference between an electric field amplitude at the apex of tip 504 with a first electrical potential applied to shunt 602 and an electric field amplitude at the apex of tip 504 with a second electrical potential applied to shunt 602 is 0 V/Å or more (e.g., 1 V/Å or more, 2 V/Å or more 3 V/Å or more, 4 V/Å or more, 5 V/Å or more, 6 V/Å or more, 8 V/Å or more, 10 V/Å or more) and/or 20 V/Å or less (e.g., 18 V/Å or less, 16 V/Å or less, 14 V/Å or less, 12 V/Å or less). In some embodiments, a ratio of the electric field amplitude at the apex of tip 504 with a first electrical potential applied to shunt 602 and the electric field amplitude at the apex of tip 504 with a second electrical potential applied to shunt 602 is 1.0 or more (e.g., 1.2 or more, 1.5 or more, 2.0 or more, 3.0 or more, 5.0 or more, 10.0 or more).

In certain embodiments, a difference between an electric field amplitude at the apex of tip 504 with shunt 602 in a fully retracted position and an electric field amplitude at the apex of tip 504 with shunt 602 in a fully extended position is 0 V/Å or more (e.g., 1 V/Å or more, 2 V/Å or more 3 V/Å or more, 4 V/Å or more, 5 V/Å or more, 6 V/Å or more, 8 V/Å or more, 10 V/Å or more) and/or 20 V/Å or less (e.g., 18 V/Å or less, 16 V/Å or less, 14 V/Å or less, 12 V/Å or less). In certain embodiments, a ratio of the electric field amplitude at the apex of tip 504 with shunt 602 in a fully extended position to the electric field amplitude at the apex of tip 504 with shunt 602 in a fully retracted position is 1.0 or more (e.g., 1.2 or more, 1.5 or more, 2.0 or more, 3.0 or more, 5.0 or more, 10.0 or more).

Computer Hardware and Software

In general, any of the methods described above—including adjustment of a feed gas supply to a charged particle source, mechanical adjustment of a field shunt, and adjustment of electrical potentials applied to elements such as tips, field shunts, and extractors—can be implemented by electronic control system 170 in computer hardware or software, or a combination of both. The methods can be implemented in computer programs using standard programming techniques following the methods and figures described herein. Program code is applied to input data to perform the functions described herein and generate output information. The output information is applied to one or more output devices such as a display monitor. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits preprogrammed for that purpose.

Each such computer program is preferably stored on a storage medium or device (e.g., ROM or magnetic diskette) readable by a general or special purpose programmable computer, for configuring and operating the computer when the storage media or device is read by the computer to perform the procedures described herein. The computer program can also reside in cache or main memory during program execution. The analysis methods can also be implemented as a computer-readable storage medium, configured with a computer program, where the storage medium so configured causes a computer to operate in a specific and predefined manner to perform the functions described herein.

OTHER EMBODIMENTS

The charged particle sources discussed previously are typically gas field ion sources. In general, however, the field shunts disclosed herein can be used in other charged particle systems, including liquid metal ion sources (LMISs), electron beam sources, and other types of ion sources.

Although helium and other noble gas particles are discussed previously for use in producing charged particle beams, in general, a wide variety of different gas particles can be used, including noble gas atoms, metal atoms, various diatomic, triatomic, and more generally, polyatomic gas particles, and various heteronuclear gas particles.

Other embodiments are in the claims.

What is claimed is:

1. A charged particle source, comprising:
   a tip having an apex;
   at least one gas inlet configured to supply gas particles to the tip;
   an element having a curved surface positioned to adsorb un-ionized gas particles, and to direct desorbing gas particles to propagate toward the tip;
   a field shunt connected to the tip, and configured to adjust an electric field at the apex of the tip; and
   a mechanism configured to cause the field shunt to move relative to the tip to adjust the electric field at the apex of the tip.

2. The charged particle source of claim 1, wherein the element is an extractor.

3. The charged particle source of claim 2, wherein the curved surface is a surface of the extractor that faces the tip.

4. The charged particle source of claim 1, further comprising an extractor, wherein the element is positioned between the tip and the extractor.

5. The charged particle source of claim 1, wherein the at least one gas inlet comprises 2 or more gas inlets.

6. The charged particle source of claim 1, wherein the element comprises a plurality of apertures positioned to permit removal of gas particles from the charged particle source.

7. The charged particle source of claim 1, wherein the curved surface is spherical.

8. The charged particle source of claim 1, wherein the curved surface is parabolic.

9. The charged particle source of claim 1, wherein the curved surface is an arc-shaped surface that corresponds to an angular arc of more than 180 degrees.

10. The charged particle source of claim 1, wherein the curved surface is shaped so that surface normals to at least 50% or more of the curved surface intersect at the position of the tip.

11. The charged particle source of claim 1, wherein the charged particle source is configured so that, during operation, a concentration of gas particles at the position of the tip is larger by 5% or more than a concentration of gas particles at the position of the tip in the absence of the curved surface.

12. The charged particle source of claim 1, wherein, the charged particle source is configured so that during operation, an average ionization efficiency of the gas particles is 3 parts in $10^{10}$ or more.

13. The charged particle source of claim 1, wherein, the charged particle source is configured so that during operation, a beam current of the charged particle source is 100 pA or more, and a pressure of gas particles in the charged particle source is $1\times10^{-3}$ Torr or less.

14. The charged particle source of claim 1, wherein the mechanism comprises an electronic controller coupled to the field shunt.

15. The charged particle source of claim 1, further comprising an electronic controller coupled to the field shunt, and configured to adjust an electrical potential applied to the field shunt to adjust the electric field at the apex of the tip.

16. The charged particle source of claim 1, wherein the field shunt is extendible along a direction parallel to an axis of the charged particle source.

17. The charged particle source of claim 1, wherein the charged particle source is a gas field ion source.

18. The charged particle source of claim 1, wherein:
the mechanism is configured to move the field shunt between a fully retracted position and a fully extended position,
in the fully retracted position of the field shunt, the electric field at the apex of the tip has a first amplitude;
in the fully extended position of the field shunt, the electric field at the apex of the tip has a second amplitude; and
the second amplitude is larger than the first amplitude.

19. A charged particle source, comprising:
a tip and at least one gas inlet configured to supply gas particles to the tip;
a field shunt configured to modulate an electric field at an apex of the tip; and
a mechanism configured to move the field shunt between a fully refracted position and a fully extended position, wherein;
in the fully retracted position of the field shunt, the electric field has a first amplitude at the apex of the tip;
in the fully extended position of the field shunt, the electric field has a second amplitude at the apex of the tip; and
the second amplitude is larger than the first amplitude.

20. The charged particle source of claim 19, wherein the mechanism comprises an electronic controller coupled to the field shunt.

21. The charged particle source of claim 19, wherein the mechanism comprises an electronic controller coupled to the field shunt, and configured to adjust an electrical potential applied to the field shunt.

22. The charged particle source of claim 19, wherein the field shunt is extendible along a direction parallel to an axis of the charged particle source.

23. A charged particle source, comprising:
a tip having an apex;
a housing that encloses the tip;
at least one gas inlet in fluid communication with an interior of the housing and configured to supply gas particles to the tip;
an element positioned within the housing and configured to modulate an electric field amplitude at an apex of the tip; and
a mechanism configured to cause the element to move relative to the tip to modulate the electric field at the apex of the tip,
wherein the element has a cylindrical portion and a conical portion attached to the cylindrical portion;
wherein a maximum internal diameter of the conical portion corresponds to an internal diameter of the cylindrical portion, and a minimum internal diameter of the conical portion is less than the maximum internal diameter, and
wherein an end of the element corresponding to the minimum internal diameter is positioned adjacent to the tip.

24. The charged particle source of claim 23, wherein:
the mechanism is configured to move the element between a fully retracted position and a fully extended position,
in the fully retracted position of the element, the electric field has a first amplitude; and
in the fully extended position of the element, the electric field has a second amplitude larger than the first amplitude.

25. The charged particle source of claim 23, wherein the mechanism comprises an electronic controller coupled to the element.

26. The charged particle source of claim 23, further comprising an electronic controller coupled to the element, and configured to adjust an electrical potential applied to the element to adjust the electric field at the apex of the tip.

27. The charged particle source of claim 23, wherein the element is extendible along a direction parallel to an axis of the charged particle source.

\* \* \* \* \*

UNITED STATES PATENT AND TRADEMARK OFFICE
CERTIFICATE OF CORRECTION

| | | |
|---|---|---|
| PATENT NO. | : 8,124,941 B2 | Page 1 of 1 |
| APPLICATION NO. | : 12/493566 | |
| DATED | : February 28, 2012 | |
| INVENTOR(S) | : John A. Notte, IV | |

It is certified that error appears in the above-identified patent and that said Letters Patent is hereby corrected as shown below:

<u>Column 10,</u>
Line 32, Delete "degrss" and insert --degrees--

<u>Column 13,</u>
Line 6, Delete "differenece" and insert --difference--

<u>Column 19,</u>
Line 38, Delete "refracted" and insert --retracted--

Signed and Sealed this
Seventeenth Day of April, 2012

David J. Kappos
*Director of the United States Patent and Trademark Office*